US006885557B2

(12) United States Patent
Unrein

(10) Patent No.: US 6,885,557 B2
(45) Date of Patent: Apr. 26, 2005

(54) HEATSINK ASSEMBLY

(75) Inventor: Edgar J. Unrein, Steilacoom, WA (US)

(73) Assignee: Intel Corporaiton, Santa Clara, CA (US)

( * ) Notice: Subject to any disclaimer, the term of this patent is extended or adjusted under 35 U.S.C. 154(b) by 53 days.

(21) Appl. No.: 10/422,707

(22) Filed: Apr. 24, 2003

(65) Prior Publication Data
US 2004/0212963 A1 Oct. 28, 2004

(51) Int. Cl.[7] ............................................. H05K 7/20
(52) U.S. Cl. ...................... 361/704; 361/719; 257/718; 24/458; 248/510
(58) Field of Search ................................. 361/703, 704, 361/719; 257/718, 719, 727; 174/16.1, 16.3; 165/80.3, 185; 24/457, 458; 248/505, 510

(56) References Cited

U.S. PATENT DOCUMENTS

| 5,883,782 | A | * | 3/1999 | Thurston et al. | ............ 361/704 |
| 5,883,783 | A | * | 3/1999 | Turturro | ...................... 361/704 |
| 6,008,990 | A | * | 12/1999 | Liu | ............................. 361/704 |
| 6,046,905 | A | * | 4/2000 | Nelson et al. | .............. 361/704 |
| 6,141,220 | A | * | 10/2000 | Lin | ............................. 361/704 |
| 6,154,365 | A | * | 11/2000 | Pollard et al. | .............. 361/704 |
| 6,243,266 | B1 | * | 6/2001 | Lo | .............................. 361/704 |
| 6,307,747 | B1 | * | 10/2001 | Farnsworth et al. | ........ 361/704 |
| 6,381,136 | B1 | * | 4/2002 | Nelson et al. | .............. 361/704 |
| 6,746,270 | B2 | * | 6/2004 | Peterson et al. | ............ 439/487 |

* cited by examiner

Primary Examiner—Boris Chervinsky
(74) Attorney, Agent, or Firm—Carrie A. Boone, P.C.

(57) ABSTRACT

A system assembly for the retention of heatsinks, in particular, high-mass heatsinks, is disclosed. The system assembly includes a backplate with standoffs extending transverse to a system board, for securing a heatsink to the system board. The standoffs effectively distribute the mass of the heatsink away from the system board, the processor, and socket, minimizing damage to these components. A TIM spring disposed within the backplate provides upward pressure to the system assembly to uniformly spread a thermal interface material between the processor and the heatsink, thereby facilitating effective heat transfer.

21 Claims, 4 Drawing Sheets

HEATSINK ASSEMBLY

FIELD OF THE INVENTION

This invention relates to microprocessor retention devices and, more particularly, to retention designs that support high-mass heatsinks.

BACKGROUND OF THE INVENTION

As the speed and power demands of microprocessors have grown, the use of heatsinks has become common. Heatsinks are devices that are disposed upon a microprocessor, in order to transfer heat away from the microprocessor. Like the microprocessors themselves, heatsinks may be found in a variety of shapes and sizes. As the amount of heat produced by a microprocessor increases, the heatsinks typically grow in size and weight.

When two smooth surfaces, such as a microprocessor and a heatsink, are placed in contact with one another, air voids between the surfaces impede effective heat flow. Thermal interface materials (TIMs), usually made up of viscous materials like grease or other thermal phase change materials, fill in the spaces between the two surfaces and are used to improve the transfer of heat between the devices. The thermal interface materials conform to the otherwise rough and uneven mating surface of the smooth objects, providing a substantially flat interface that ensures close contact between all portions of the microprocessor and heatsink.

Most heatsinks are coupled to the microprocessor using a thermal interface material. An assembly including thermal interface material between the microprocessor and the heatsink is more effective at transferring heat to the heatsink than simply coupling the heatsink directly to the microprocessor. By properly loading the assembly, a uniform thermal interface between the heatsink and the microprocessor, and, thus, better heat transfer, can be achieved. The thermal interface material may be designed for loads of 10–90 psi (pounds per square inch) or higher.

Some heatsinks are clipped upon a socket of the microprocessor and are mounted to the system board. The clipped-on heatsinks typically weigh about 200 grams. The spring clips provide two functions: they hold the heatsink in place and they load the assembly so that a uniform thermal interface between the heatsink and the processor is formed.

Heavier heatsinks may be connected to the processor differently. Although still mounted to the system board, a 400-gram heatsink, for example, would likely be mounted through holes in the system board to a chassis. Despite the sturdier connection to the microprocessor, these heatsinks nevertheless fail shock and vibration tests, particularly when forces perpendicular to the thermal interface material are applied to the assembly.

In some systems, heatsinks are constructed using copper, rather than aluminum, due to the better heat conduction properties of copper. Since copper is a heavier material than aluminum, relatively heavier heatsinks are to be expected with this material. Heatsinks weighing 1000 grams or more have become common. With this significant weight, meeting shock and vibration testing requirements becomes increasingly difficult.

The printed circuit board upon which the microprocessor and heatsink are retained is designed to be somewhat rigid. Some flexion of the printed circuit board may occur, but component failure is more likely when the board is flexed.

In addition to the impedance, trace width, and other considerations of the system design, the mass of any component placed upon the printed circuit board can impair signal integrity. Shock and vibration testing will likely fail if the weight of one or more components on the printed circuit board exceeds board specifications.

The mass of the heatsink can also damage the processor, the processor pins, or the socket. Like the printed circuit board, these components are rated to have predefined load limits. Where the heatsink is spring-clipped, the excess mass of the heatsink overloads the springs, causing excessive deflection to the printed circuit board, the processor, and/or the socket.

During shock and vibration testing, a system board is generally tested in three dimensions. Thus, the effect upward and downward forces in the X-axis, the Y-axis, and the Z-axis (perpendicular to the system board) are measured. Although failures in testing the other axes also occur, during the Z-axis testing in particular, the weight of the heatsink can adversely affect system components, such as the system board, the processor socket, and the processor itself.

In shock and vibration tests in which the force applied to the system is perpendicular to the thermal interface material (Z-axis testing), the heatsink is actually pulled away from the processor, due to the presence of the TIM. The grease-like thermal interface material covers the surface area of the processor. As the heatsink is pulled quickly during the perpendicular load testing, the grease causes a suctioning effect, and the load ends up being transferred to the processor pins. The force may quickly pull the processor from its socket, damaging the processor pins, the socket, and/or the processor.

Thus, there is a continuing need to provide a heatsink retention mechanism that supports high-mass heatsinks and meets typical shock and vibration testing criteria.

DETAILED DESCRIPTION

In accordance with the embodiments described herein, a system assembly is disclosed for the retention of heatsinks, in particular, heatsinks with a high relative mass. As used herein, high-mass heatsinks are defined to be heatsinks that weight 400 grams or more, and, more preferably, 700 grams or more. The system assembly includes a backplate to secure a heatsink to a chassis without springs or clips. Located beneath a system board, the backplate effectively distributes the mass of the heatsink to the chassis, rather than upon or through the system board. The heatsink, the backplate, and the chassis make up a rigid sub-assembly, separate from the system board and processor. The redistribution of heatsink mass minimizes system board deflection, as well as damage to the processor, processor pins, or socket.

The system assembly further provides uniform TIM loading using a free-floating sub-assembly, separate from the rigid sub-assembly. The free-floating sub-assembly includes a TIM spring, the system board and the processor. The TIM spring, located beneath the system board, provides upward pressure to the system board and processor, causing the thermal interface material to be uniformly disposed between the processor and the heatsink. The uniform TIM loading eliminates the need for specialized clips for coupling the processor, TIM, and heatsink together.

The system assembly performs well during shock and vibration testing. The rigid sub-assembly reduces the mass to be borne by the microprocessor, particularly forces perpendicular to the TIM. Likewise, the TIM spring within the free-floating sub-assembly is effective to uniformly spread the thermal interface material between the processor and the heatsink.

In the following detailed description, reference is made to the accompanying drawings, which show by way of illustration specific embodiments in which the invention may be practiced. However, it is to be understood that other embodiments will be come apparent to those of ordinary skill in the art upon reading this disclosure. The following detailed description is, therefore, not to be construed in a limiting sense, as the scope of the present invention is defined by the claims.

Figure 1:
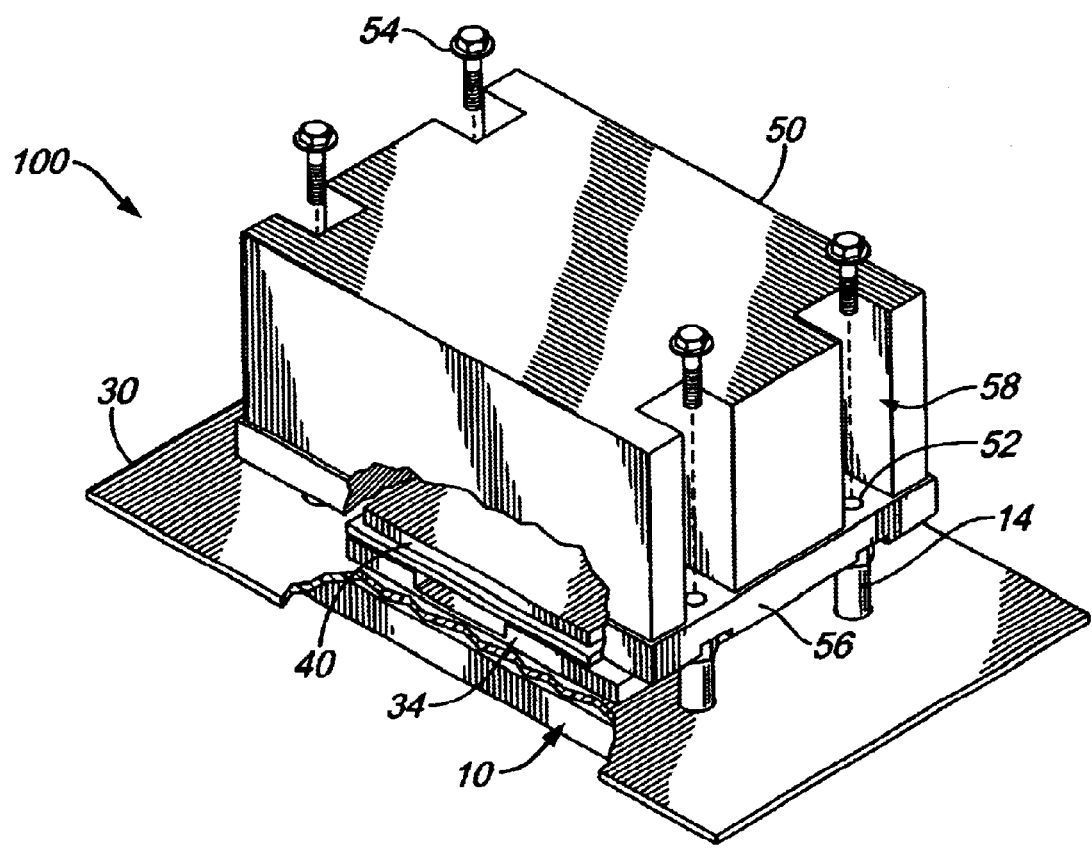
FIG. 1 is a perspective view of the system assembly according to some embodiments of the invention.
Figure 2:
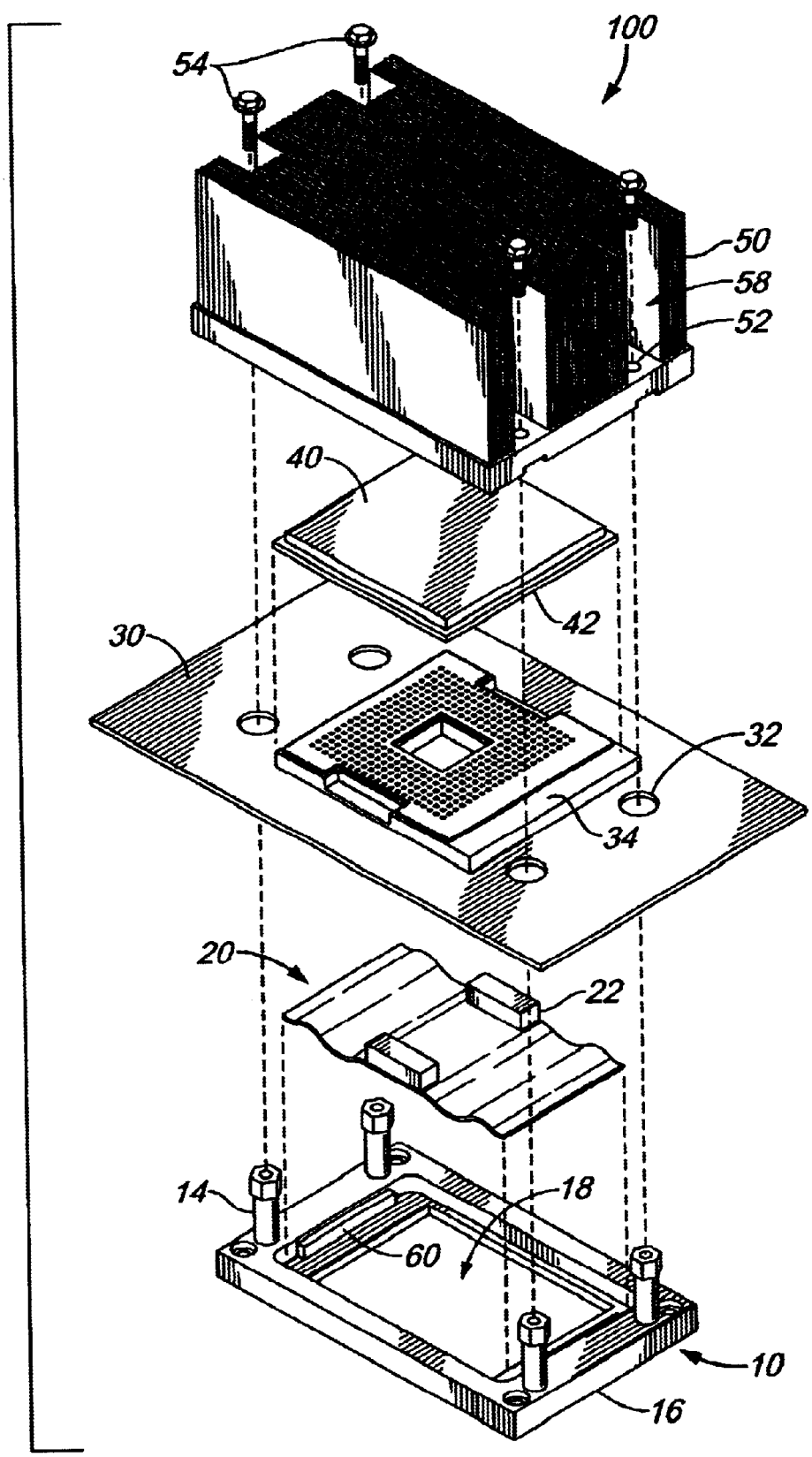
FIG. 2 is an exploded perspective view of the system assembly of FIG. 1 according to some embodiments of the invention.

FIGS. 1 and 2 are perspective and exploded views, respectively, of a system assembly 100, according to some embodiments. The system assembly 100 includes a backplate 10, a TIM spring 20, a system board 30, a processor 42, and a heatsink 50. The processor 42, which includes a thermal interface material 40, is assembled into a socket 34 of the system board 30. The system assembly 100 may thus be part of a processor-based system, such as a desktop computer, a server system, and the like. More generally, the system assembly 100 may be useful in any system in which a heat-producing semiconductor is thermally managed using a heatsink.

As used herein, a heatsink is defined to be a device which, when coupled to a microprocessor or other heat-producing semiconductor device, causes heat to be transferred away from that device. Heatsinks may include fins, embedded cooling towers, cold plates, fans, refrigeration systems, and other features to facilitate this heat-transferring process. Without limitation, the heatsink 50 of the system 100 may employ any or all of these features.

The processor 42 includes a substrate and a silicon structure known as a die, plus an integrated heat spreader, all of which are bonded together. The processor 42 may be formed from ceramic, a plastic pin grid array (PGA), or other packaging material. On top of the die is the thermal interface material 40. The thermal interface material, or TIM 40, is a viscous substance, such as grease, or another thermal phase change material, which causes a surface of the processor 42 to be in substantial contact with the a surface of the heatsink. (When the components are arranged as in the figures, the top of the processor will be in substantial contact with the bottom of the heatsink). Ideally, the thermal interface material 40 provides a uniform thermal interface between the processor 42 and the heatsink 50, for more efficient heat transfer.

As an alternative to the processor 42, the system 100 may include any heat-producing semiconductor device, such as a gate array or other custom-made integrated circuit, a digital signal processor, or a programmable logic device.

The backplate 10 of the system assembly 100 includes a frame 16, an opening 18, and threaded standoffs 14. The standoffs 14 extend transverse to the frame 16. Where the system board 30 is horizontal, such as in FIGS. 1 and 2, the standoffs 14 are vertically disposed. In some embodiments, the threaded standoffs are connected directly to a chassis (not shown), which encloses the system assembly 100. The chassis may, for example, be the housing of a processor-based system, the chassis comprising a substantially rigid metal enclosure or box.

The standoffs 14 are threaded to receive one or more screws 54. The screws 54 engage with the threaded standoffs 14 to rigidly secure the heatsink 50 to the backplate 10 and, ultimately, to a chassis. Dotted lines in FIG. 2 illustrate the connection path between the screw 54 and the threaded standoffs 14. The rigid mounting of the heatsink to the chassis provides a path through which the mass of the heatsink can be distributed. This rigid sub-assembly, however, does not include the processor 42 or the system board 30, which are effectively bypassed from receiving the load of the heatsink mass.

To achieve this "load bypass" effect, the system board 30 includes clearance holes 32, through which the standoffs 14 pass. The clearance holes 32 are large enough that the standoffs 14 will fit through without being constrained, so that the board 30, the socket 34, and the processor assembly 42 are free to move up and down, while the heatsink 50 and the backplate 10 are rigidly affixed to a chassis. The heatsink 50 includes a base portion 56 including holes 52 for receiving screws 54, thereby coupling the heatsink 50 to the threaded standoffs 14. As used herein, the system assembly 100 is said to be engaged when the threaded standoffs are disposed through the large clearance holes 32 of the system board 30 and the screws 54 are fully received into the threaded standoffs 14.

The frame 16 of the backplate 10 includes a pair of surfaces 60, one of which is fully visible in FIG. 2. In some embodiments, the surfaces 60 are soft foam double-adhesive strips attached to the frame 16 of the backplate 10. The foam surfaces 60 help to center the TIM spring 20 upon the backplate 10. When the system assembly 100 is engaged, the TIM spring 20 is compressed, which increases its length. The foam surfaces 60 help to center the TIM spring 20 in both its compressed and uncompressed states.

The frame 16 of the backplate 10 also includes holes 64, for receiving screws to affix or bolt the frame 16 to a chassis. Alternatively, the frame 16 may be machined as part of a customized chassis.

The system assembly 100 thus includes two independent sub-assemblies: a rigid sub-assembly comprising the heatsink 50, the backplate 10, which are typically coupled to a chassis; and a free-floating sub-assembly comprising the processor 42, including the TIM 40, the system board 30, and the TIM spring 20. By isolating the mass of the heatsink from the free-floating sub-assembly, shock and vibration tests, particularly perpendicular load tests, can be successful.

In prior art heatsink assemblies, the mass of the heatsink is essentially locked. This is because all assembly components are either bolted or spring-clipped together. The mass of the heatsink thus imparts its load on the processor assembly, the socket, and the system board, sometimes causing damage to these parts.

In the system assembly 100 of FIGS. 1 and 2, by contrast, the heatsink may be mounted to a chassis via the standoffs and backplate, resulting in a relatively rigid sub-assembly. Typically, the chassis has its own compliance limit; however, most chassis are relatively stiff structures that can support heavy-mass heatsinks.

In the free-floating sub-assembly, the mass that is allowed to move is the mass that's being controlled by the TIM spring 20. This includes the mass of the processor assembly 42, the socket 34, and a localized region of the system board 30, al of which are typically lighter than the heatsink 50. The TIM spring 20 is designed to support these lower mass components during shock and vibration testing. This eliminates the need for specialized clips to support the heavy mass heatsink.

The clips are further used to achieve a uniform spreading of the TIM material between the microprocessor and the heatsink. The spring clips may, for example, wrap around a portion of the heatsink to engage with a receiving mechanism attached to the system board. This uniform spreading, or TIM loading, ensures that efficient heat transfer to the heatsink takes place.

In the system assembly 100, the TIM spring 20 beneath the system board 30 replaces the typical TIM clips. Seated within the opening 18 of the backplate 10, the TIM spring 20 supplies a substantial upward pressure, when the system assembly 100 is engaged. This upward pressure effectively spreads the TIM 40 between the heatsink 50 and the processor assembly 42. The TIM spring 20 is an elongated member, comprising a strong, but flexible material, such as sheet metal, aluminum, or other alloys, which is stretched along the opening 18 of the backplate, sitting upon the surfaces 60.

The exploded view of FIG. 2 shows blocks 22 affixed to the TIM spring 20. The blocks 22 provide spacing between the TIM spring 20 and the back of the system board 30, wherein the back of the system board is the side not including the processor. The back of the system board 30 may have discrete components, such as solder mask, solder bumps, or decoupling caps, extending from the board material. The blocks 22 ensure that these discrete components do not make contact with the TIM spring 20.

The blocks 22 may be arranged differently than as shown in FIG. 2. Alternatively, the TIM spring 20 can be machined to have predetermined portions missing, such as where discrete components will be. The TIM spring 20 may, for example, have holes at predetermined locations along its surface. As another alternative, the TIM spring 20 may comprise two or more independent portions, spaced such that discrete components on the underside of the system board may simultaneously occupy the region between the springs.

When the system assembly 100 is engaged, the configuration of the TIM spring 20 causes a force to be applied on a localized region of the system board adjacent to the spring. Substantially, this force is transferred to the system board 30 via the blocks 22. The blocks may be made of epoxy materials, such as polymer glue, elastomeric materials, plastics, and other materials. The arrangement of the blocks 22 in FIG. 2 represents but one of several possible configurations of the TIM spring 20.

Figure 3:
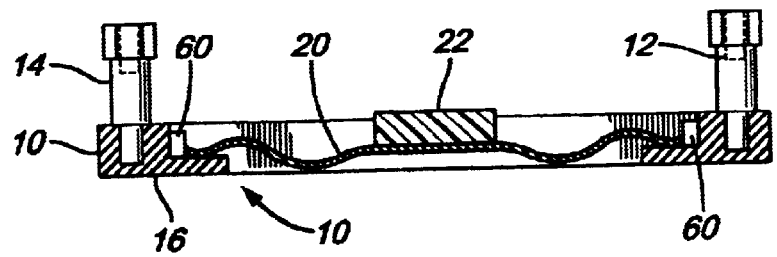
FIG. 3 is a side view of the backplate and TIM spring assemblies for the system assembly of FIG. 1 according to some embodiments of the invention.

In FIG. 3, the TIM spring 20 is shown flexed inside the opening 18 upon engagement of the spring assembly 100. The TIM spring 20 sits upon the surfaces 60 of the backplate 10. The surfaces 60 center the TIM spring 20 within the opening 18 of the backplate 10.

Figure 4:
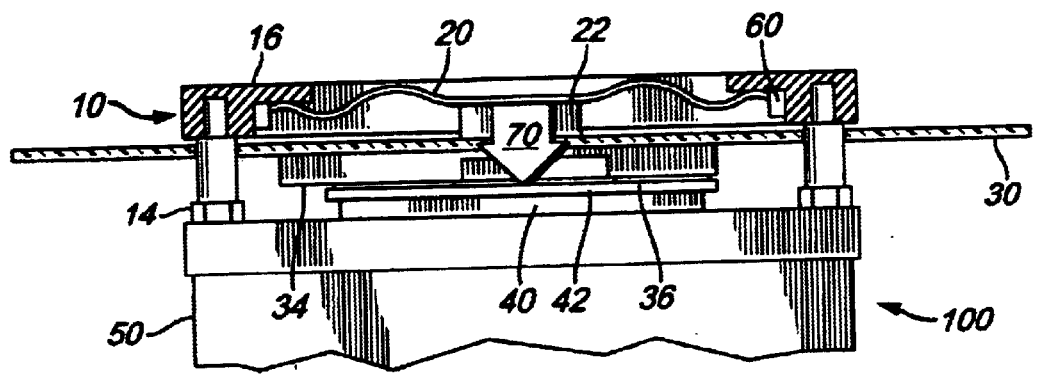
FIG. 4 is a side view of the system assembly of FIG. 1 illustrating the upward force of the spring according to some embodiments of the invention.

In FIG. 4, a side view of the system assembly 100 illustrates how the TIM spring 20 is effective to spread the TIM 40 between the heatsink 50 and the processor 42. The system assembly 100 is upside down from the orientation of the other figures so that the effect of the heatsink mass can be illustrated.

A force 70 is depicted as a downward facing arrow. When the system assembly 100 is engaged, the TIM spring 20 produces the force 70, which applies pressure to the localized region of the system board 30 and the processor 42, which are positioned adjacent to the TIM spring 20. Where the system board 30 is disposed horizontally, the TIM spring 20 produces the force 70 to the system board 30, the processor 42, the TIM 40, and the heatsink 50.

The force 70 is a localized force, in that the pressure occurring on the TIM spring 20 when the system assembly 100 is engaged moves locally between the spring itself, through the affixed blocks 22, along a localized region of the system board 30 situated directly adjacent to the processor 42 (such as above the processor in FIG. 4). The force 70 is not distributed along a significant portion of the system board beyond the localized region by the TIM spring 20. Accordingly, the system board 30 is not unnecessarily stressed beyond the localized region. The force 70 results in a substantially uniform coupling of the heatsink 50 and the processor 42, via the TIM 40, to achieve effective heat transfer away from the processor.

To achieve uniform TIM spreading, the amount of the force 70 applied by the system assembly 100 is dependent on the type of material from which the TIM 40 is made. The force exerted by the TIM spring 20 can be adjusted in accordance with the characteristics of the TIM 40. In some embodiments, using a 700-gram heatsink, the force 70 is approximately 92 pounds applied to two square inches, to provide 46 psi of TIM loading.

To secure the rigid sub-assembly, the heatsink 50 includes flutes 58, screws 54, a base 56, and holes 52. The flutes 58 provide clearance for the receipt of the screws 54, and are generally made large enough for a tool, such as a screwdriver, to be used. The flutes 58 are generated from cut portions of the heatsink fins. Alternatively, the corners or some other region of the heatsink fins may be cut, such that the screws 54 can be disposed through holes 52 in the base 56 of the heatsink 50, for affixing to the standoffs 14. Once the screws 54 are fully threaded into the standoffs 14, the system assembly 100 is fully engaged.

By configuring the system assembly 100 in this manner, the shock and vibration caused by the weight of the heatsink during an impact event is substantially absorbed by the standoffs 14, bypassing the free-floating sub-assembly. Put another way, the weight of the heatsink 50 is not substantially borne by the system board 30, the processor 42, or the socket 34. Further, the free-floating components are minimally deflected during such impact events, reducing the possibility of damage to them.

Figure 5:
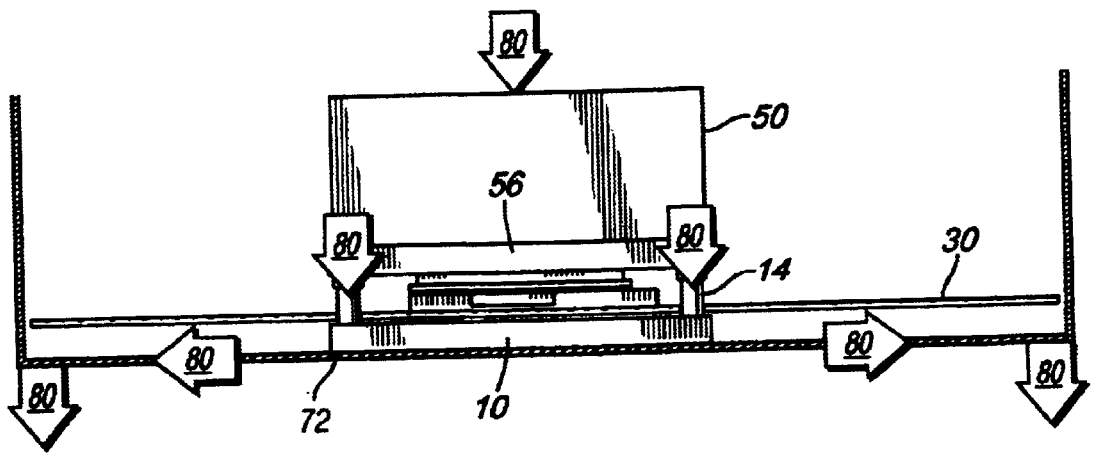
FIG. 5 is a side view of the system assembly of FIG. 1 illustrating the impact of shock loading forces according to some embodiments of the invention.

In the side view of FIG. 5, the system assembly 100 is coupled to a chassis 72. A second force 80, different from the force 70 of FIG. 4, depicts the manner in which a shock-loading force is distributed through the system assembly 100 to the chassis 72. The distributed force 80 is illustrated using arrows that pass through, not along, the system board 30, being absorbed instead by the chassis 72.

During typical shock and vibration testing, shock-loading tests in the X, Y, and Z axis directions are performed. For example, in a "minus-Z-axis test," the chassis 72 may be dropped some distance while the effects on the system are measured. Shock loading is an abrupt application of a load to an environment, such as the system board 30, which maximally stresses the environment immediately when the load is applied. The force 80 of FIG. 5 is but one example of many shock loading forces that may be performed.

When the force 80 is applied to the system assembly 100, the force is distributed, passing transverse to, or across, the system board 30 rather than along or through the system board. As the arrows illustrate, the force 80 is distributed first through the standoffs 14, to the backplate 10, which is itself coupled to the chassis 72. As intended, the force 80 thus bypasses the system board 30, substantially protecting the system board from damaging effects. In some embodiments, a shock-loading force of 50 G is effectively distributed away from the system board 30 using the system assembly 100.

The force that does impact the system board 30, the processor 42, and the socket 34 is the force 70 exerted by the TIM spring 20 (see FIG. 4), such that uniform spreading of the TIM material 40, and, thus, effective heat transfer to the heatsink 50, occurs. Relative to the force 80, the force 70 is minimal, according to some embodiments. By avoiding the effects of the force 80, processor-based systems using the system assembly 100 may experience better results with shock and vibration testing than prior art heatsinks.

Even when the chassis 72 is in an "at rest" position, the weight of the heatsink 50 supplies a load to the system. Like the shock-loading force, the heatsink weight force is distributed through the transversely positioned standoffs 14, substantially avoiding the system board 30. Thus, using the system assembly 100, heatsinks may increase to weights not heretofore feasible.

In the illustrations above, a passive heatsink is depicted. However, the system assembly 100 can be employed with active heatsinks, such as those including heat pipes, fans, cooling towers, refrigeration units or other hardware that facilitates the effective transfer of heat from the semiconductor device.

Some systems, such as server and other high-end computers, may include multiple microprocessors on a single system board. Since the weight of the heatsink 50 of the system assembly 100 does not load the system board 30, the processor socket 34, or the processor 42, the system assembly 100 can be used to simultaneously encompass multiple processors.

Figure 6:
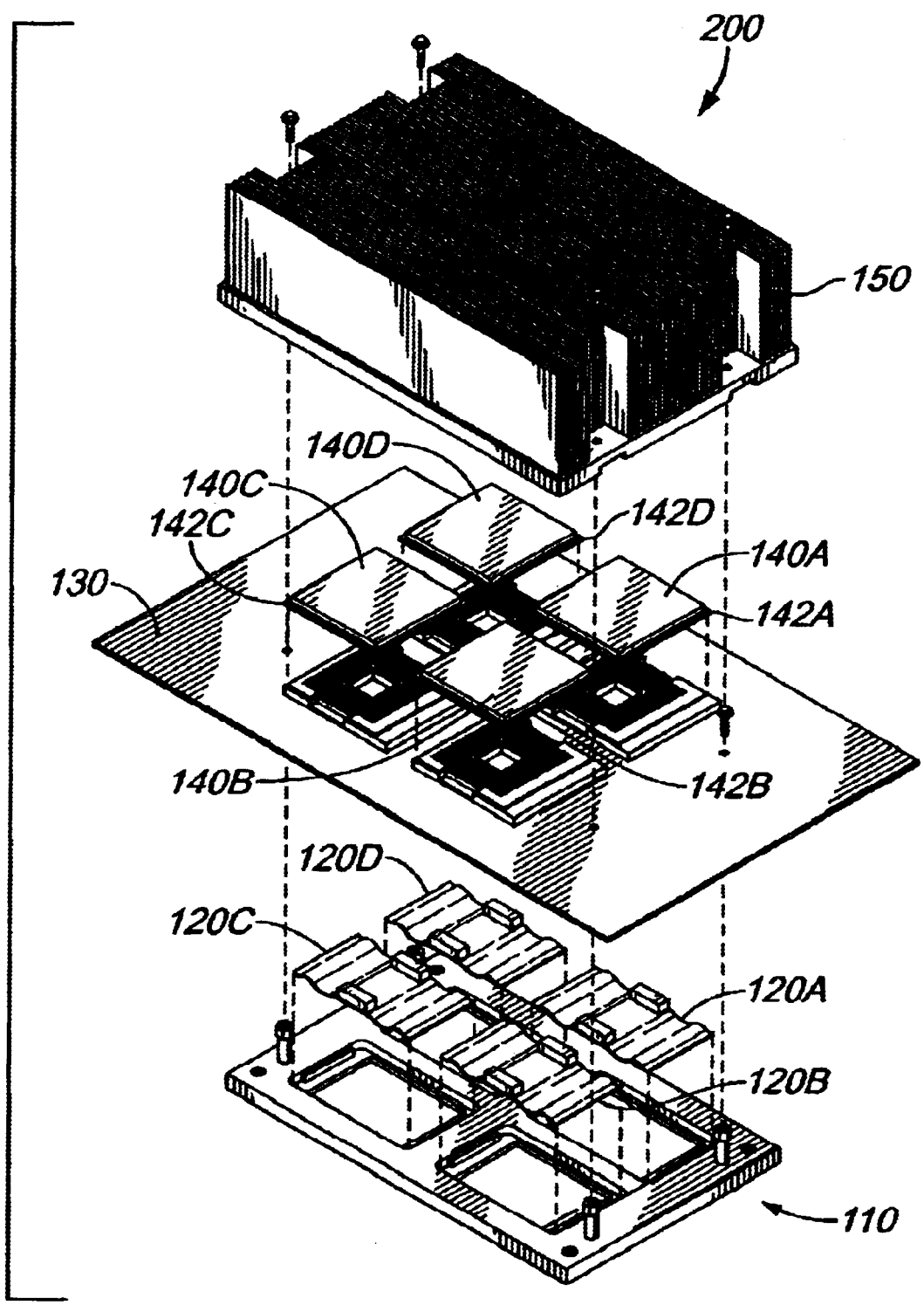
FIG. 6 is a perspective view of a system assembly used in a multiprocessor environment according to some embodiments of the invention.

As shown in FIG. 6, a heatsink 150 is part of a system assembly 200, for simultaneous use with multiple processors of a multiprocessing system. Each processor 142A, 142B, 142C, and 142D (collectively, processors 142) has its own dedicated TIM spring 120A, 120B, 120C, and 120D (collectively, TIM springs 120), which supplies the upward pressure needed to ensure uniform loading of the associated TIM material 140A, 140B, 140C, and 140D (collectively TIM material 140).

The processors 142 in FIG. 6 appear to be identical in size and shape. However, since a separate TIM spring is allocated for each processor 142, each TIM spring 120 can be tailored to meet the characteristics of the associated processor 142. This means that the processors need not be identical in size, shape, and other properties, but can each have unique characteristics.

As in the system assembly 100, the system assembly 200 includes a rigid subassembly including the heatsink 150 and a backplate 110, to be fixably attached to a chassis (not shown), and a free-floating subassembly including the processors 142, the TIM materials 140, and the system board 130. The single heatsink 150 successfully transfers heat from the processors 142A, 142B, 142C, and 142D by uniformly spreading the respective TIM materials 140A, 140B, 140C, and 140D, so that effective heat transfer to the heatsink 150 occurs.

The backplate 110 is designed to have distinct openings for receiving each of the TIM springs 120A, 120B, 120C, and 120D. As an alternative configuration, the system assembly 200 can employ separate backplates, one for TIM spring. The separate backplates would each have distinct connection points to the heatsink 150.

Even if the heatsink weight could somehow be controlled, such as by using very lightweight materials, prior art heatsinks are unable to simultaneously support multiple microprocessors. The overall dimensions of each processor from the top of the system board to the bottom of the heatsink, is likely to vary between processors. Thus, supporting multiple processors with a single heatsink would not be possible, because each processor may be loaded differently.

In contrast, the dedicated TIM springs 120 of the system assembly 200 can properly load the processor such that uniform TIM spreading occurs for each processor. Since the system board 130 is free-floating, the weight of the heatsink does not substantially load the system board, the processor, or the processor socket.

While the invention has been described with respect to a limited number of embodiments, those skilled in the art will appreciate numerous modifications and variations therefrom. It is intended that the appended claims cover all such modifications and variations as fall within the true spirit and scope of the invention.

I claim:

1. A system assembly, comprising:
 a rigid sub-assembly, comprising:
  a heatsink; and
  a backplate comprising threaded standoffs for connection to the heatsink, wherein the backplate may be affixed to a chassis; and
 a free-floating sub-assembly, comprising:
  a system board;
  a processor, for connection to a socket on the system board;
  a thermal interface material disposed atop the processor, for coupling the processor to the heatsink; and
  a spring beneath the system board, the spring occupying an opening of the backplate;
 wherein the spring exerts an upward force when the system assembly is engaged such that the thermal interface material is uniformly disposed between the processor and the heatsink.

2. The system assembly of claim 1, wherein the heatsink further comprises a base including holes, wherein the holes receive screws to be received into the threaded standoffs of the backplate.

3. The system assembly of claim 2, wherein the system board further comprises clearance holes for receiving the standoffs, wherein the clearance holes are large enough that the free-floating sub-assembly is able to move freely when the system assembly is engaged.

4. The system assembly of claim 3, wherein the spring further includes one or more blocks disposed between the spring and the underside of the system board, such that the spring avoids contact with components located on the underside of the system board.

5. The system assembly of claim 1, wherein the thermal interface material is a phase change material.

6. The system assembly of claim 1, wherein the thermal interface material is grease.

7. The system assembly of claim 1, wherein a mass of the heatsink is not absorbed by the free-floating sub-assembly.

8. A system assembly, comprising:
   a rigid sub-assembly, comprising:
      a heatsink; and
      a backplate comprising a plurality of threaded standoffs for connection to the heatsink; and
   a free-floating sub-assembly, comprising:
      a system board;
      a processor, for connection to a socket on the system board; and
      a thermal interface material disposed atop the processor, for coupling the processor to the heatsink;
      a spring disposed beneath the system board, the spring occupying an opening of the backplate;
      wherein the spring exerts an upward force when the system assembly is engaged such that the thermal interface material is uniformly disposed between the processor and the heatsink;
   wherein a mass of the heatsink is not absorbed by the free-floating sub-assembly.

9. The system assembly of claim 8, further comprising a chassis, wherein the backplate is affixed to the chassis.

10. The system assembly of claim 8, wherein the backplate is part of a customized chassis.

11. The system assembly of claim 8, wherein the thermal interface material is uniformly disposed between the processor and the heatsink without the use of a dedicated clip.

12. The system assembly of claim 8, wherein the heatsink is a high-mass heatsink.

13. A method, comprising:
   connecting a heatsink to a backplate to form a rigid assembly, wherein the backplate is located beneath a system board, the backplate being capable of rigidly affixing the heatsink to a chassis; and
   engaging a processor into a socket located on the system board, wherein the system board includes holes for allowing the backplate to connect to the heatsink; disposing a spring in an opening of the backplate; and sandwiching a thermal interface material between the processor and the heatsink; wherein an upward force is exerted by the spring such that the thermal interface material is uniformly disposed between the heatsink and the processor;
wherein a mass of the heatsink is not absorbed by the system board, the socket, or the processor.

14. The method of claim 13, further comprising:
   testing the rigid assembly such that a force perpendicular to the thermal interface material results;
wherein the mass of the heatsink is still not absorbed by the system board, the socket, or the processor.

15. A method, comprising:
   connecting a heatsink to a backplate, wherein the backplate is located beneath a system board, the backplate being capable of rigidly affixing the heatsink to a chassis; and
   engaging a processor into a socket located on the system board, wherein a thermal interface material is disposed atop the processor, for coupling the processor to the heatsink; and
   disposing a spring in an opening of the backplate beneath the system board;
wherein the spring exerts an upward pressure on the processor such that the thermal interface material is uniformly disposed between the processor and the heatsink.

16. The method of claim 15, further comprising:
   allocating holes in the system board for threading standoffs extending from the backplate, such that the system board is free-floating when the heatsink is connected to the backplate;
wherein a mass of the heatsink is not absorbed by the system board, the socket, or the processor.

17. The method of claim 15, further comprising:
   testing the rigid assembly such that a force perpendicular to the thermal interface material results;
wherein the mass of the heatsink is still not absorbed by the system board, the socket, or the processor.

18. A system assembly, comprising:
   a rigid sub-assembly, comprising:
      a heatsink; and
      a backplate, comprising threaded standoffs for connection to the heatsink, wherein the backplate may be affixed to a chassis; and
   a free-floating sub-assembly, comprising:
      a system board;
      a plurality of processors, for connection to a plurality of sockets on the system board;
      a plurality of thermal interface materials disposed atop each of the plurality of processors, for coupling each processor to the heatsink; and
      a plurality of springs beneath the system board, one for each processor, wherein each spring occupies an opening of the backplate;
   wherein each of the plurality of springs exerts an upward force when the system assembly is engaged such that the respective thermal interface materials associated with each processor is uniformly disposed between the plurality of processors and the heatsink.

19. The system assembly of claim 18, wherein the system board further comprises clearance holes for receiving the standoffs, wherein the clearance holes are large enough that the free-floating sub-assembly is able to move freely when the system assembly is engaged.

20. The system assembly of claim 19, wherein the opening of the backplate comprises a plurality of distinct portions for receiving each of the plurality of springs.

21. A system assembly, comprising:
   a rigid sub-assembly, comprising:
      a heatsink; and
      a backplate comprising a plurality of threaded standoffs for connection to the heatsink; and
   a free-floating sub-assembly, comprising:
      a system board;
      a plurality of processors, for connection to a plurality of respective sockets on the system board; and
      a plurality of thermal interface materials, each disposed atop one of the respective plurality of processors, for coupling the processors to the heatsink; and a plurality of springs, one for each processor, wherein the plurality of springs are disposed beneath the system board, the plurality of springs occupying an opening of the backplate, wherein the spring exerts an upward force when the system assembly is engaged such that the plurality of thermal interface materials is uniformly disposed between the respective plurality of processors and the heatsink;
wherein a mass of the heatsink is not absorbed by the free-floating sub-assembly.

* * * * *